US006716646B1

(12) United States Patent
Wright et al.

(10) Patent No.: US 6,716,646 B1
(45) Date of Patent: Apr. 6, 2004

(54) METHOD AND APPARATUS FOR PERFORMING OVERLAY MEASUREMENTS USING SCATTEROMETRY

(75) Inventors: Marilyn I. Wright, Austin, TX (US); Kevin R. Lensing, Austin, TX (US); James Broc Stirton, Austin, TX (US); Richard J. Markle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/906,517

(22) Filed: Jul. 16, 2001

(51) Int. Cl.[7] .............................................. H01L 21/66
(52) U.S. Cl. ........................... 438/14; 438/17; 438/401
(58) Field of Search ............................ 438/14, 17, 18, 438/401; 430/30; 702/150; 356/399

(56) References Cited

U.S. PATENT DOCUMENTS

| 5,886,798 A | * | 3/1999 | Staub et al. ................... 359/2 |
| 5,905,573 A | * | 5/1999 | Stallard et al. ............. 356/345 |
| 5,923,423 A | * | 7/1999 | Sawatari et al. ............ 356/349 |
| 5,955,654 A | * | 9/1999 | Stover et al. ................. 73/1.89 |
| 6,051,348 A | | 4/2000 | Marinaro et al. ............. 430/30 |
| 6,245,584 B1 | | 6/2001 | Marinaro et al. ............. 438/14 |
| 6,248,602 B1 | * | 6/2001 | Bode et al. ................... 438/14 |
| 6,433,878 B1 | | 8/2002 | Niu et al. .................... 356/603 |
| 2002/0135781 A1 | | 9/2002 | Singh et al. ................. 356/601 |

FOREIGN PATENT DOCUMENTS

JP    2002071962   *   8/2000   ............ G02B/5/18

* cited by examiner

*Primary Examiner*—Amir Zarabian
*Assistant Examiner*—Pamela E Perkins
(74) *Attorney, Agent, or Firm*—Williams Morgan & Amerson, P.C.

(57) ABSTRACT

The present invention provides for a method and an apparatus for overlay measurements using optical techniques. At least one semiconductor device is processed. Metrology data from the processed semiconductor device is acquired. A scatterometry overlay analysis based upon the metrology data is performed. At least one modified manufacturing parameter is calculated based upon the scatterometry overlay analysis.

12 Claims, 8 Drawing Sheets

METHOD AND APPARATUS FOR PERFORMING OVERLAY MEASUREMENTS USING SCATTEROMETRY

BACKGROUND OF THE INVENTION

1. Field of the Invention

This invention relates generally to semiconductor manufacturing, and, more particularly, to a method and apparatus for using scatterometry to measure overlay errors.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include start-up effects of manufacturing machine tools, memory effects of manufacturing chambers, and first-wafer effects. One of the process steps that is adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, alignment is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month, many times, to observe trends in manufacturing processes. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes increases, improved methods are needed to revise input parameters that control manufacturing processes in a more automated and timely manner. Furthermore, wafer-to-wafer manufacturing variations can cause non-uniform quality of semiconductor devices.

A known technique for evaluating the acceptability of the photolithography process involves measuring critical dimensions or other parameters after the photoresist has been developed. One method used to evaluate the developed wafer is to use scatterometry to generate an intensity measurement indicative of the pattern on the wafer. The pattern in the developed photoresist appears as a series of trenches. Light is reflected differently in the trenched vs. the non-trenched areas, resulting in a characteristic scattering pattern. The scatterometry measurements may be used to change the photoresist operating parameters, such as exposure time, post exposure bake time, develop time, etc. to affect the pattern formed on subsequent lots of wafers. The industry today lacks an efficient manner of utilizing scatterometry techniques to efficiently calculate overlay errors and reduce variabilites in processed semiconductor wafers.

The present invention is directed to overcoming, or at least reducing the effects of, one or more of the problems set forth above.

SUMMARY OF THE INVENTION

In one aspect of the present invention, a method is provided for overlay measurements using optical techniques. At least one semiconductor device is processed. Metrology data from the processed semiconductor device is acquired. A scatterometry overlay analysis based upon the metrology data is performed. At least one modified manufacturing parameter is calculated based upon the scatterometry overlay analysis.

In another aspect of the present invention, an apparatus is provided for overlay measurements using optical techniques. The apparatus of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data organizer coupled with the metrology, the metrology data organizer being capable of organizing the acquired metrology data; and a scatterometry data analysis unit coupled with the metrology data organizer and the computer system, wherein the scatterometry data analysis unit capable of performing a scatterometry overlay analysis to determine whether a significant overlay exists on a processed semiconductor wafer.

BRIEF DESCRIPTION OF THE DRAWINGS

The invention may be understood by reference to the following description taken in conjunction with the accompanying drawings, in which like reference numerals identify like elements, and in which.

Figure 1:
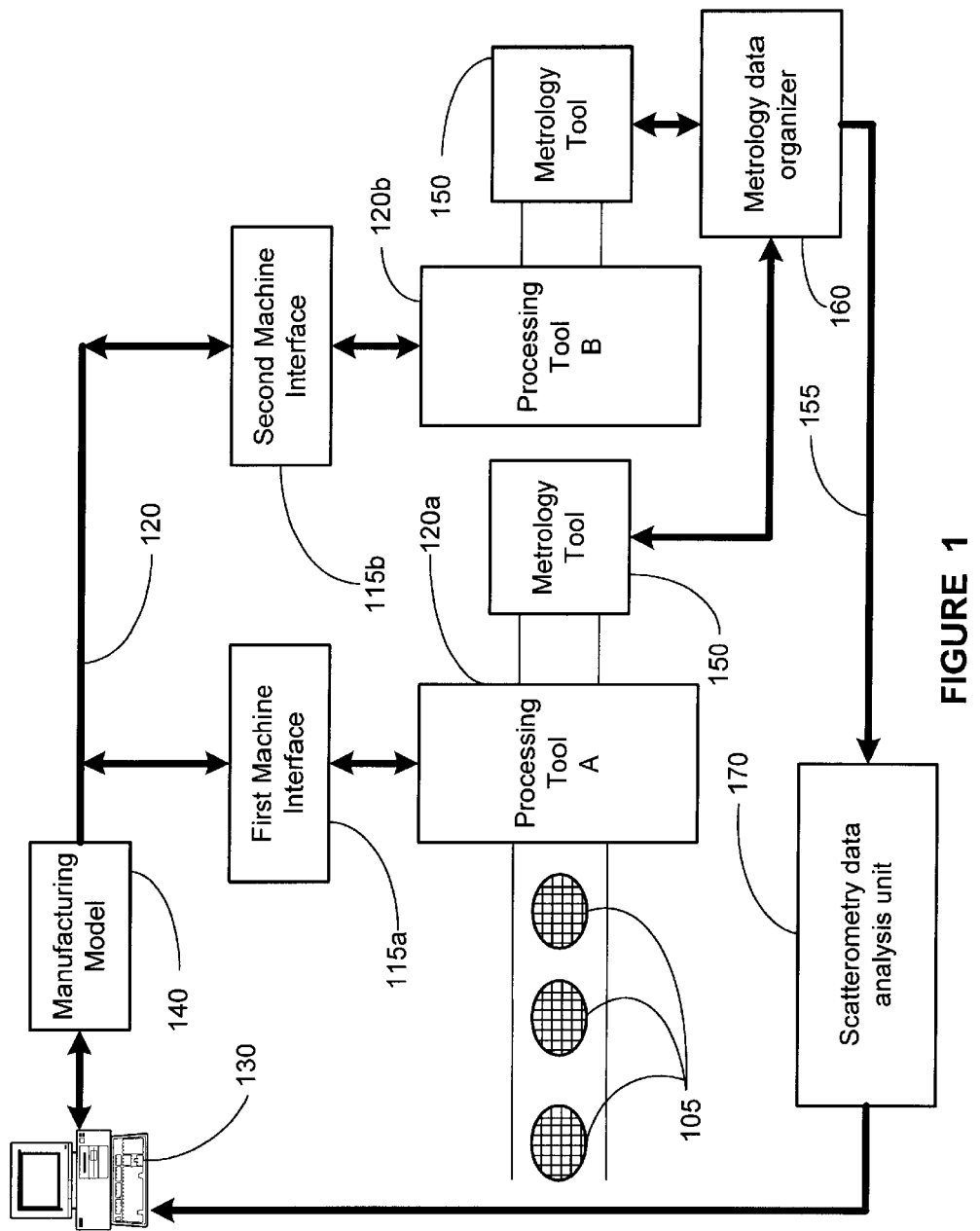
FIG. 1 illustrates a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer and wafer-lot to wafer-lot variations can result in an output of non-uniform semiconductor devices. Furthermore, fast, efficient, and accurate identification of process errors can improve overall results in semiconductor manufacturing environments. Embodiments of the present invention provide for performing utilizing scatterometer techniques to perform measurement upon superimposed grating structures to calculate overlay errors. Embodiments of the present invention can be utilized to perform overlay error analysis and critical dimension analysis substantially simultaneously.

Semiconductor devices are processed in a manufacturing environment using a number of input control parameters.

Turning now to FIG. 1, a system 100 in accordance with one embodiment of the present invention is illustrated. In one embodiment, semiconductor products 105, such as semiconductor wafers, are processed on processing tools 120a, 120b using a plurality of control input signals, or manufacturing parameters, on a line 123. In one embodiment, control input signals, or process signals, on the line 123 are sent to the processing tools 120a, 120b from a computer system 130 via machine interfaces 115a, 115b. In one embodiment, the first and second machine interfaces 115a, 115b are located outside the processing tools 120a, 120b. In an alternative embodiment, the first and second machine interfaces 115a, 115b are located within the processing tools 120a, 120b.

In one embodiment, the computer system 130 sends control input signals, or manufacturing parameters, on the line 123 to the first and second machine interfaces 115a, 115b. The computer system 130 employs a manufacturing model 140 to generate the control input signals on the line 123. In one embodiment, the manufacturing model 140 contains a manufacturing recipe that determines a plurality of control input parameters that are sent on the line 123.

In one embodiment, the manufacturing model 140 defines a process script and input control that implement a particular manufacturing process. The control input signals on a line 123 that are intended for processing tool A 120a are received and processed by the first machine interface 115a. The control input signals on a line 123 that are intended for processing tool B 120b are received and processed by the second machine interface 115b. Examples of the processing tools 120a, 120b used in semiconductor manufacturing processes are steppers, scanners, step-and-scan tools, and etch process tools. In one embodiment, processing tool A 120a and processing tool B 120b are photolithography process tools, such as steppers.

One or more of the semiconductor wafers that are processed by the processing tools 120a, 120b can also be sent to a metrology tool 150 for acquisition of metrology data. The metrology tool 150 can be a scatterometry data acquisition tool, an overlay-error measurement tool, a critical dimension measurement tool, and the like. In one embodiment, one or more processed semiconductor wafers are examined by a metrology tool 150. Data from the metrology tool 150 is collected by a metrology data organizer 160. The metrology data organizer 160 organizes, analyses, and correlates scatterometry metrology data acquired by the metrology tool 150, to particular semiconductor wafers that were examined. The metrology data organizer 160 can be a software unit, a hardware unit, or a firmware unit. In one embodiment, the metrology data organizer 160 is integrated into the computer system 130. The scatterometry data analysis unit 170 is capable of calculating overlay errors and compensation factors, such as modified control parameters, to compensate for overlay errors. scatterometry data analysis unit 170 can be a software unit, a hardware unit, or a firmware unit. In one embodiment, the scatterometry data analysis unit 170 is integrated into the computer system 130.

Among the bases for modifying the control input signal on the line 123 are metrology measurements, inline and external measurement, performed on processed semiconductor wafers, such as scatterometry measurements. The metrology measurements are used to perform a feedback modification of the control input signals. In one embodiment, the feedback modification of the control input signals on the line 123 are performed on photolithography processes, such as line width adjustments using photo exposure dosages and line profile adjustments using exposure focus modifications. Feedback modification of the control input signal on the line 123 can also be performed on etch processes, such as etch line shape adjustments using etch recipe modifications.

In the context of a manufacturing process such as a stepper process, the control inputs on the line 123 that are used to operate the processing tool 120 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool.

When a process step in the processing tool 120 is concluded, the semiconductor wafer that is being processed in the processing tool 120, in one embodiment, is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, the modifications to the control input signals on the line 123 are based on the effects of external variables on the semiconductor devices being processed. The error detection and error compensation described above, in one embodiment, is performed on a field to field basis.

The present invention provides for acquiring scatterometry metrology data on semiconductor wafers that are being processed by the system 100. Scatterometry metrology is a non-contact semiconductor wafer inspection technique used to acquire metrology data from the semi conductor wafer. Scatterometry measurements can be used for particle detection, estimation of particle sizing, and for roughness measurement of smooth silicon wafer surfaces.

Figure 2:
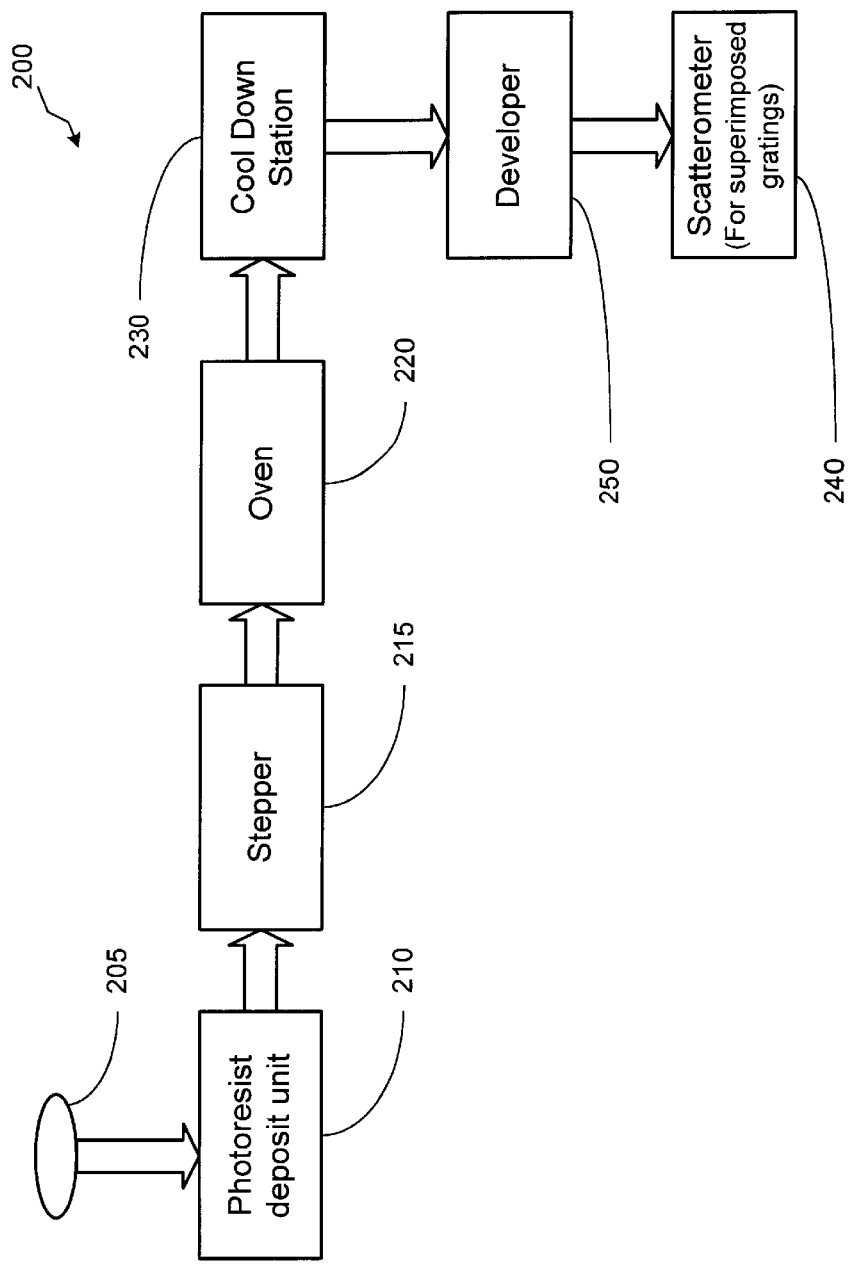
FIG. 2 illustrates a simplified diagram of a processing line for performing photolithography patterning.

Referring now to FIG. 2, a simplified diagram of an illustrative processing line 200 for performing photolithography patterning is depicted. The processing line 200 includes a photoresist deposition unit 210, a stepper 215, an oven 220, a cool down station 230, a developer 250, and a scatterometer 240. The photoresist deposition unit 210 receives a semiconductor wafer 205, and deposits a predetermined thickness of photoresist material upon the surface of the wafer 205. The stepper 215 then receives the wafer 205 (i.e., or lot of semiconductor wafers) and exposes the wafer 205 to a light source using a reticle to pattern the wafer 205. The wafer 205 is transferred to the oven 220, where a post exposure bake is conducted. Following the post exposure bake, the wafer 205 is transferred to the cool down station 230, and then to the developer 250 after the wafer 205 has sufficiently cooled. The developer 250 removes exposed photoresist material from the wafer 205.

The wafer 205 is then transferred to the scatterometer 240 for measurements. As described in greater detail below, the scatterometer 240 measures the wafer 205 to determine the acceptability and/or uniformity of the previously performed photolithography processes and conveys wafer measurements to the memory data organizer 160. The computer system 130, which is integrated with the APC framework adjusts the recipe of the stepper 215 based on the wafer measurements. As will be recognized by those of ordinary skill in the art in light of this disclosure, the processing line 200 may include discrete or integrated processing tools for performing the processing steps described herein. The data acquired by the scatterometer 240 is used for making modifications to the control input signals on the line 123, which control the processing tools 120.

Figure 3:
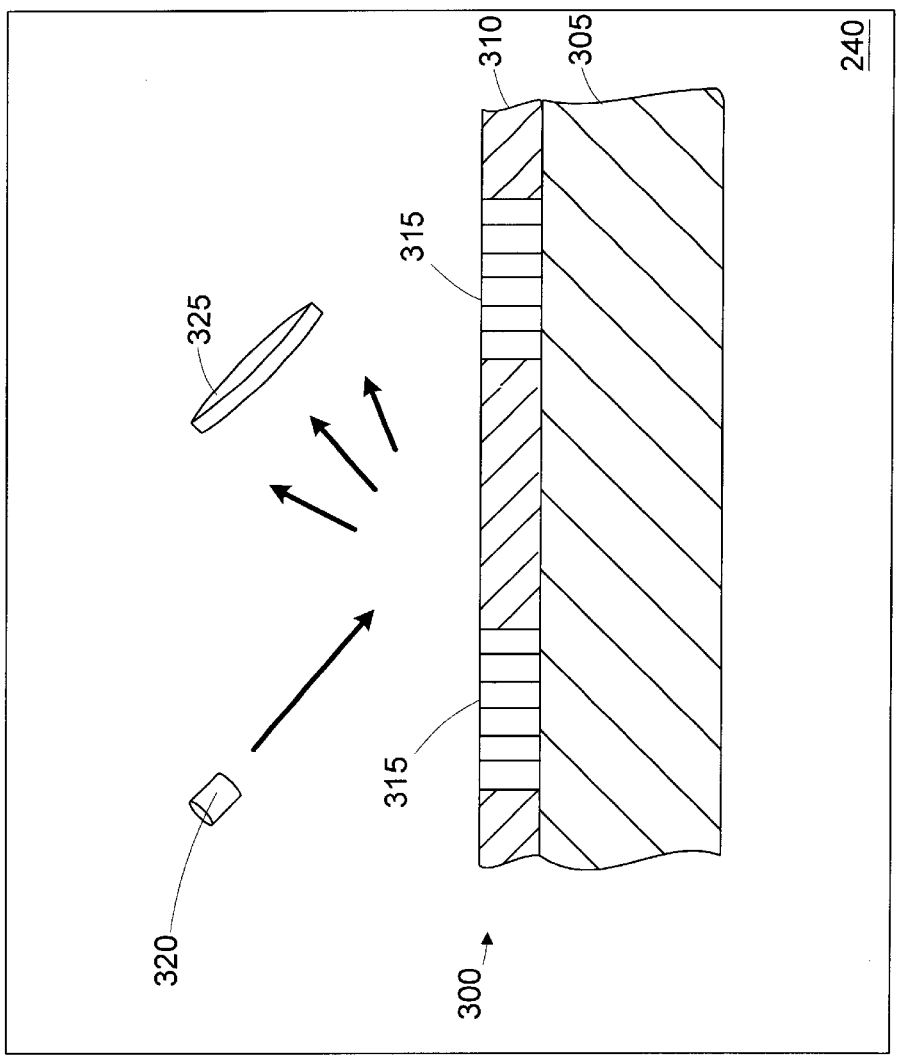
FIG. 3 illustrates a simplified view of the scatterometer with the semiconductor wafer loaded therein.

Referring to FIG. 3, a simplified view of the scatterometer 240 with the wafer 205 loaded therein is provided. The wafer 205 has a base material 305. The photoresist layer 310 has baked regions 315 formed on the base material 305 resulting from the previous exposure and baking steps (i.e., referred to as a patterned wafer 205). The chemical change resulting in the change in solubility of the baked regions 315 also results in the baked regions 315 having an index of refraction different than that of the unexposed portions of the photoresist layer 310.

In one embodiment, the scatterometer 240 comprises a light source 320 and a detector 325 positioned proximate the wafer 205. The light source 320 of the scatterometer 240 illuminates at least a portion of the wafer 205, and the detector 325 takes optical measurements, such as intensity and unique optical signatures, of the reflected light. Although the invention is described using a scatterometer 240 designed to measure optical signatures from the reflected light, it is contemplated that other measurement tools, such as an ellipsometer, a reflectometer, a spectrometer, or some other light measuring device may be used. It is also contemplated that the scatterometer 240 may use monochromatic light, white light, or some other wavelength or combinations of wavelengths, depending on the specific implementation. The angle of incidence of the light may also vary, depending on the specific implementation.

The differences in the refractive indices for the baked regions 315 and the unexposed portions of the photoresist layer 310 cause light scattering, resulting in a decrease in the intensity (or other optical signatures) of the reflected light as compared to scattering in the photoresist layer 310 before exposure and baking. The scatterometer 240 measures the optical signatures at different points on the wafer 205, such as on the periphery and in the middle. A difference in the light intensity between various points indicates a nonconformity, such as a variation in the line widths of the baked regions 315. The light analyzed by the scatterometer 240 typically includes a reflected component and a scattered component. The reflected component corresponds to the light component where the incident angle equals the reflected angle. The scattered component corresponds to the light component where the incident angle does not equal the reflected angle. For purposes of discussion hereinafter, the term "reflected" light is meant to encompass both the reflected component and the scattered component.

The computer system 130, in conjunction with the manufacturing model 140, adjusts the recipe of the stepper 215 to correct the nonconformity. For example, if a unique spectral signature associated with the periphery of the wafer 205 is different from a spectral signature associated with the middle of the wafer 205, the line width may be presumably less, because a smaller line width causes less scattering, changing the spectral signature. To correct the line width variation, the computer system 130 changes the recipe of the stepper 215 such that the exposure sites (e.g., individual die)

with smaller line widths receive either an increased energy exposure or a longer duration exposure.

Detecting variations and adjusting the stepper 215 recipe prior to the developer 150 allows a quicker corrective action response. It is contemplated that all of the wafers 205 in a lot may be tested, or only selected wafers 205 in the lot. Identifying variations early allows correction of wafers 205 even in the same lot. For more stable steppers 215, the scatterometer 240 may be used only once per shift or once per week, depending on the specific implementation.

In the illustrated embodiment, the photoresist layer 310 is of a chemically-amplified type. In cases where a non-chemically-amplified photoresist material is used, the scatterometer 240 may be stationed prior to the oven 120. In a non-amplified photoresist system, the pattern is essentially complete after exposure in the stepper 215. The post exposure bake in the oven 220, which may be optional, is conducted to smooth the edges in the pattern resulting from standing waves, rather than to complete the patterning. Thus, the exposed portions already have an index of refraction different than the unexposed patterns, and the scatterometer 240 may be used. Scatterometry data is processed and correlated by the metrology data organizer 160. The scatterometry data is then analyzed by the scatterometry data analysis unit 170, which uses the scatterometry data to perform feedback control of subsequent processing of semiconductor wafers.

Figure 4:
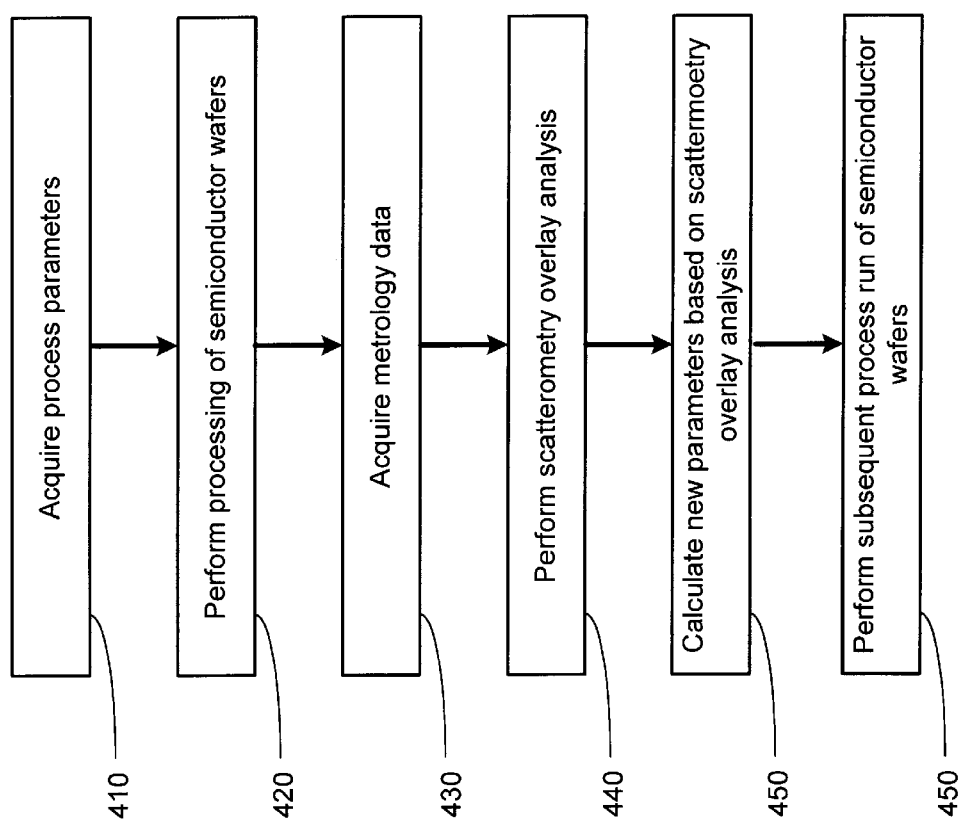
FIG. 4 illustrates a flowchart depiction of a method in accordance with one embodiment of the present invention.

Turning now to FIG. 4, a flowchart depicting the method, in accordance with one embodiment of the present invention, is illustrated. In one embodiment, the machine interface 115 acquires process parameters from the computer system 130 and the manufacturing model 140 (block 410). Once the machine interface 115 acquires the process parameters, the machine interface 115 prompts the processing tools 120 to perform at least one semiconductor manufacturing process (block 420). In one embodiment, one or more photolithography process is performed on semiconductor wafers. After at least one semiconductor manufacturing process is performed on a set of semiconductor wafers, the system 100 acquires metrology data from the processed semiconductor wafers (block 430). In one embodiment, metrology data is acquired by the metrology tool 150 subsequent to processing of the semiconductor wafers. In one embodiment, the metrology tool 150 is capable of acquiring scatterometry metrology data. The scatterometry metrology data is sent to the metrology data organizer 160, which is capable of organizing the metrology data and correlating the data with the appropriate matching processed semiconductor wafer.

Figure 5:
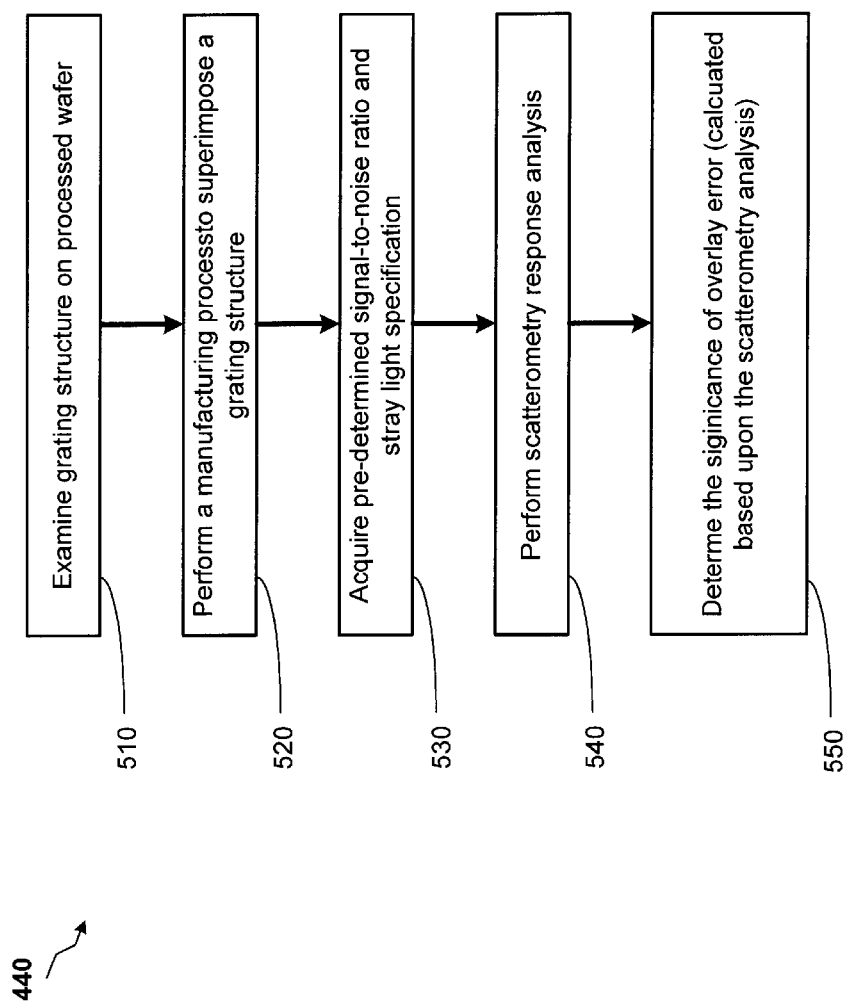
FIG. 5 illustrates a flowchart depiction of a method of performing a scatterometry overlay analysis, as described in FIG. 4, in accordance with one embodiment of the present invention.

The system 100 then performs a scatterometry overlay analysis in accordance with one embodiment of the present invention (block 440). One embodiment of the steps of performing the scatterometry overlay analysis, is illustrated in flowchart form in FIG. 5. Turning now to FIG. 5, the system 100 examines the grating structures that are processed on the semiconductor wafer (block 510). Those skilled in the art will appreciate that the grating structures on the semiconductor wafer may be placed by a photolithography process or an etch process. In one embodiment, the grating structures on the semiconductor wafer are generally less than 50 microns apart. However, the embodiment of the present invention may be implemented on semiconductor wafers that have different measurements. In one embodiment, a system 100 performs a manufacturing process to superimpose another grating structure on top of the previous layer of the semiconductor wafer that contains a grating structure (block 520). When the system 100 determines that the grating structure that is being examined is suitable for scatterometry measurements, embodiments of the present invention are implemented to check for overlay errors using scatterometry measurements.

The system 100 acquires predetermined scatterometry data relating to a plurality of types of grating structures. The system 100 receives signal-to-noise ratio specifications that have been calculated for a plurality of types of grating structures on a semiconductor wafer. Generally, grating structures that are aligned in ideally equally spaced structures, generate a substantially clear signal deflection in response to scatterometry stimulation. The more defective the grating structure, the greater the signal-to-noise ratio on the signal received in response to scatterometry stimulation imposed upon a wafer.

The system 100 generally receives or stores predetermined signal-to-noise ratio specifications for different types of grating structures that may be implemented by manufacturing processes performed by the processing tools 120. In one embodiment, the system 100 accesses a library that contains a plurality of grating structure data and corresponding signal-to-noise ratio specifications. The system 100 also can access a plurality of grating structure with corresponding stray light specifications that can result from scatterometry stimulation imposed upon a semiconductor wafer.

In one embodiment, the more imperfections and trenches that are present on a wafer, the greater the stray light refraction due to a scatterometry stimulation. The stray light characteristics of certain geometrical structures placed upon a semiconductor wafer can be characterized and placed in a library for later comparison with processed semiconductor wafers. The system 100 acquires predetermined signal-to-noise ratio specifications and stray light specifications for the grating structure that is placed upon the current semiconductor wafer being processed (block 530).

Once the system 100 superimposes a grating structure and acquires predetermined signal-to-noise ratio and stray light specifications for the particular grating structure, the system 100 performs a scatterometry response analysis (block 540). One method of performing the scatterometry response analysis is described in further details below. When the system 100 substantially completes the scatterometry response analysis, the system 100 determines overlay errors based upon the scatterometry response analyses (block 550). The completion of the methods described in FIG. 5 substantially completes the scatterometry overlay analysis process, described in block 440 of FIG. 4.

Turning back to FIG. 4, when the system 100 performs the scatterometry overlay analysis, it calculates new manufacturing parameters (e.g., alignment offset adjustment parameters) based upon the scatterometry overlay analysis (block 450). The scatterometry overlay analysis is, in one embodiment, performed by the scatterometry data analysis unit 170. The computer system 130 and the manufacturing model 140 are then utilized to calculate new manufacturing parameters to compensate for the overlay errors calculated in the scatterometry overly analysis process. The manufacturing parameters that are modified include the intensity of the light emitted during the photolithography process, the time of the exposure to the photolithography process, and the like. Once new manufacturing parameters are calculated, the system 100 performs subsequent manufacturing processes based on the new manufacturing parameters in order to produce more accurate semiconductor wafers (Block 460).

Figure 6:
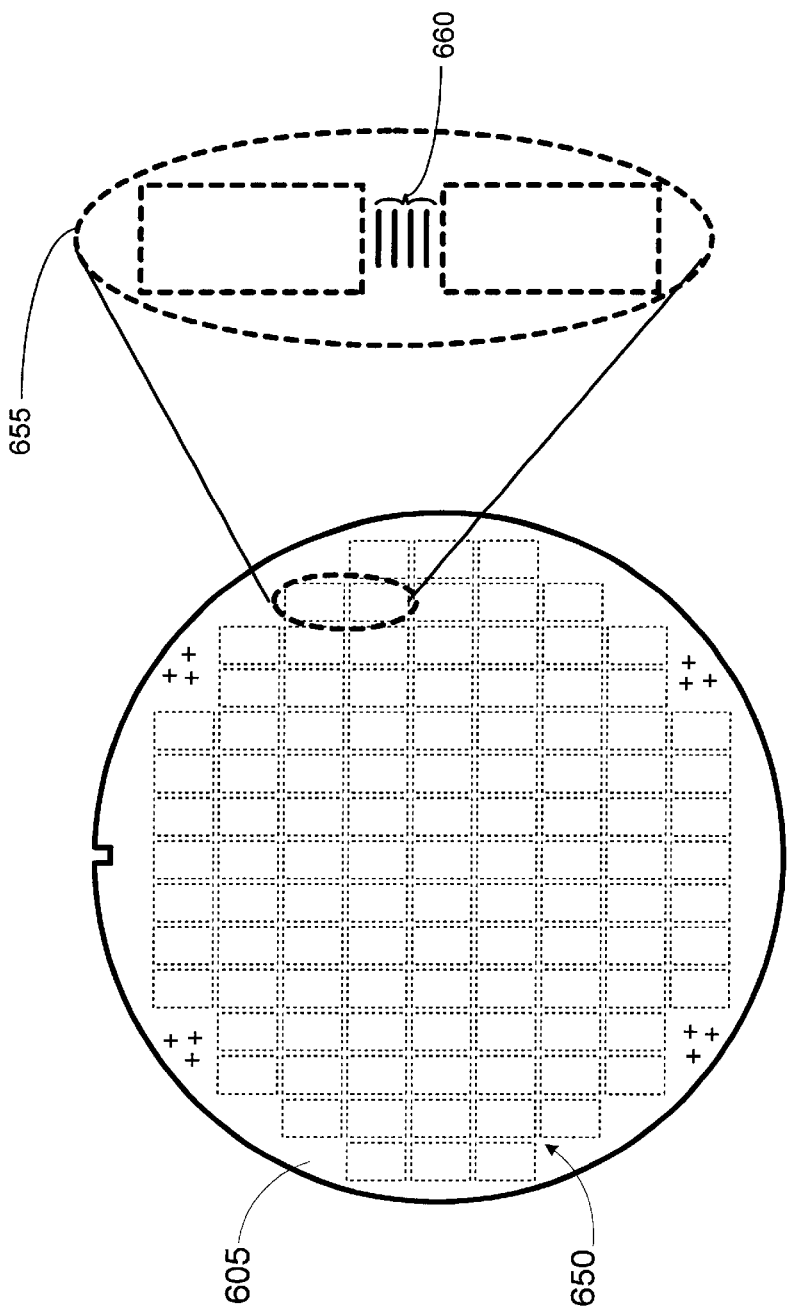
FIG. 6 illustrates a semiconductor wafer that includes grating structures.

FIG. 6 illustrates a typical wafer 605. The wafer 605 typically includes a plurality of individual semiconductor die arranged in a grid 650. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

FIG. 6 illustrates a magnified view 655 of a portion of the wafer 605. In one embodiment, the space between the grids 650 can be used to form a variety of test structures. Among the structures formed in the space between the grids 650 are grating structures 660. In one embodiment, the grating structures 660 formed on the wafer 605 has 50 micron spacing between each structure. The grating structure 660 can then be used for testing purposes, such as testing by acquiring optical reflectance data.

Figure 7:
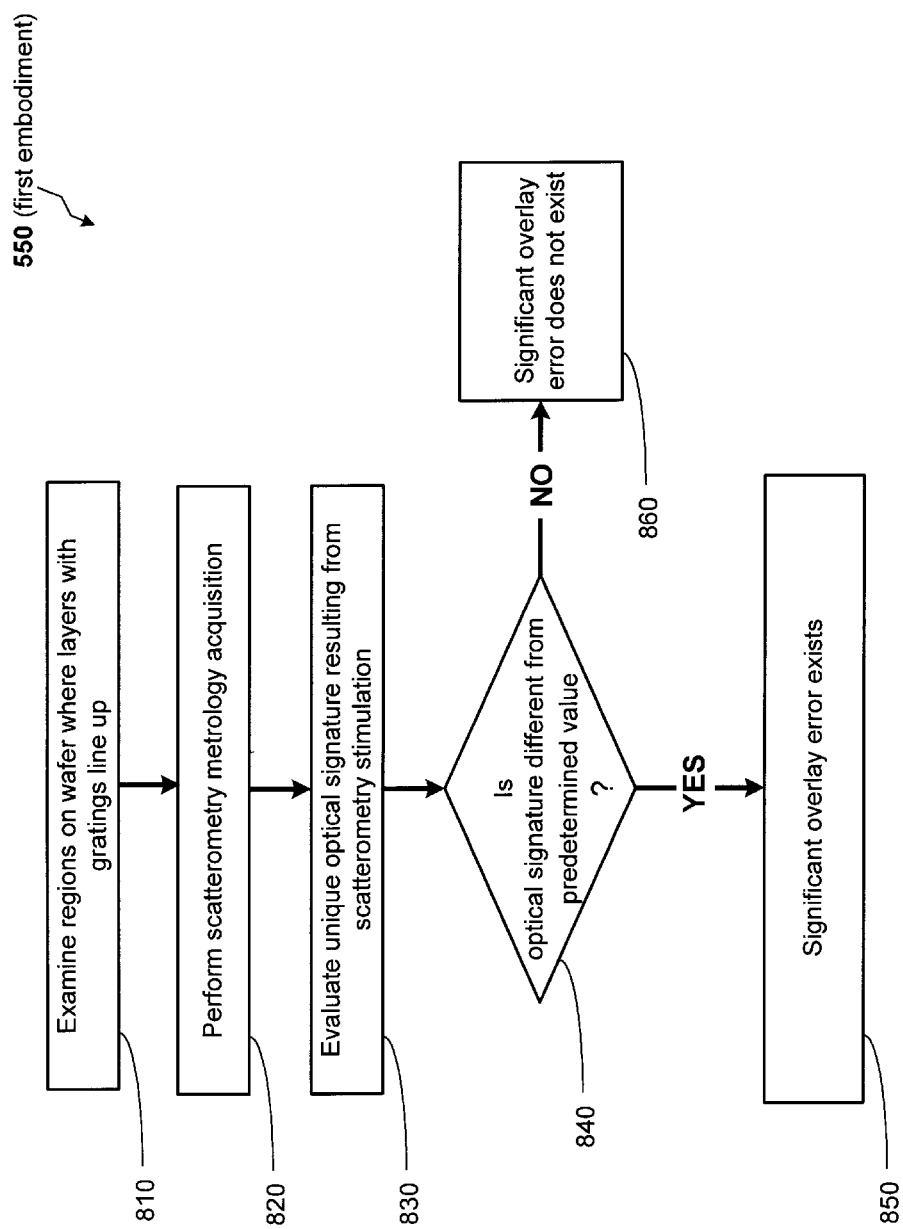
FIG. 7 illustrates a flowchart depiction of a method of performing a scatterometry response analysis, as described in FIG. 5, in accordance with a first embodiment of the present invention.

Turning now to FIG. 7, one embodiment of the method of performing a scatterometry response analysis of block 550 of FIG. 5, is illustrated. The system 100 examines critical regions on the semiconductor wafers (i.e., regions where layers with grating structures tend to line up), as indicated in block 810 of FIG. 7. The system 100 then performs a scatterometry metrology data acquisition process on the processed semiconductor wafer (block 820). In one embodiment, the scatterometry metrology data acquisition is performed by the metrology tool 150. In one embodiment, the metrology data organizer 160 receives the scatterometry metrology data from the metrology tool 150 and organizes the data such that there is a correlation between the scatterometry data received and the corresponding semiconductor wafer from which scatterometry data was acquired.

The scatterometry data analysis unit 170 then evaluates a unique optical signature relating to the response from the scatterometry stimulation imposed upon the semiconductor wafer (block 830). Upon evaluation of the optical signature data, a determination is made by the system 100 whether an optical signature is significantly different from a predetermined optical signature corresponding to the particular geometrical structure on the semiconductor wafer (block 840). As described above, the system 100 accesses previously determined and stored optical signatures for a particular geometrical structure on a semiconductor wafer. The system 100 then compares the optical signatures of the current semiconductor wafer being processed and the predetermined expected optical signatures stored in the system 100.

When a determination is made that the optical signature of the semiconductor wafer being processed is significantly different from the predetermined optical signature corresponding to the data stored in the system 100, the system concludes that a significant amount of overlay error does not exist (block 860). When the system 100 makes a determination that the optical signature of the semiconductor wafer being processed is below a predetermined optical signature for a particular wafer structure, the system 100 makes a conclusion that there may be significant overlay errors on the semiconductor wafer being processed. The completion of the steps described in FIG. 8 essentially completes a first embodiment of the method for performing the scatterometry response analysis of block 550 of FIG. 5.

Figure 8:
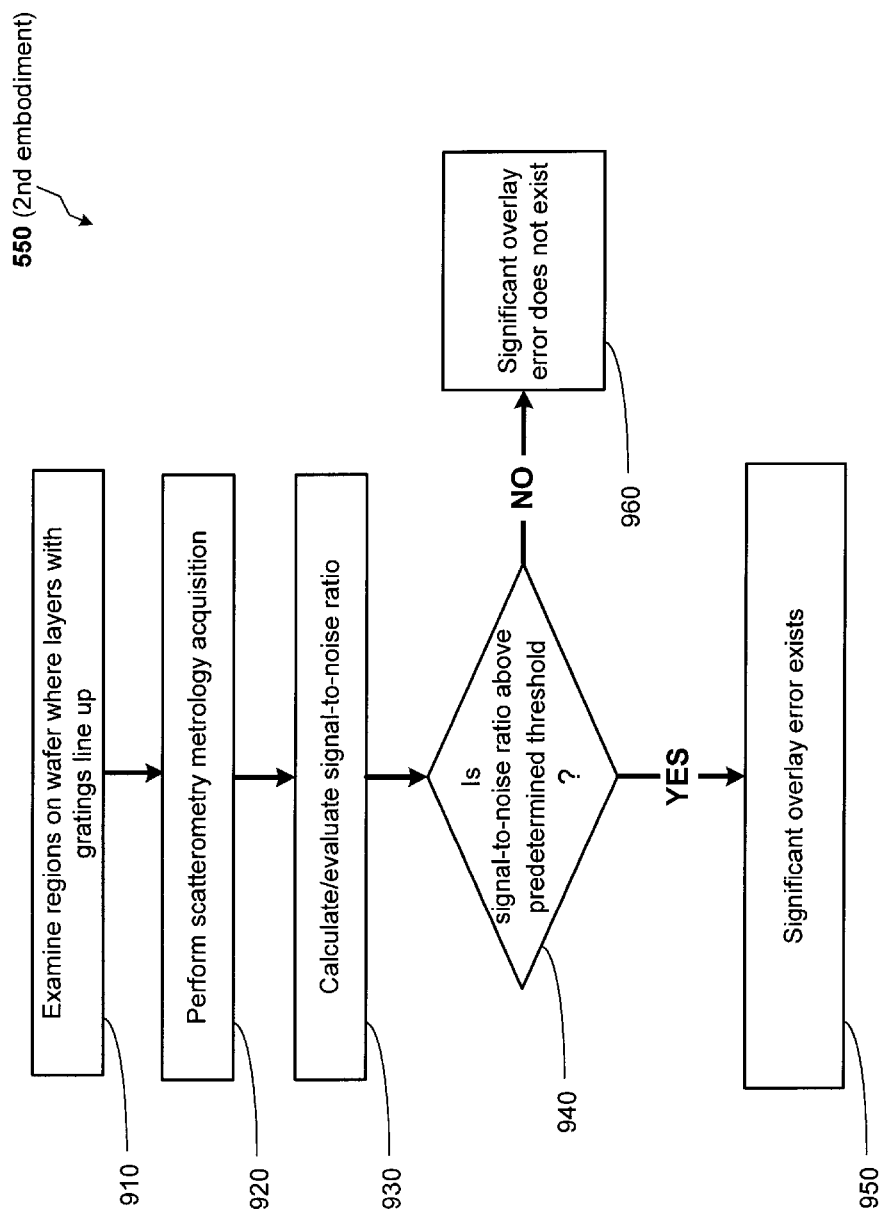
FIG. 8 illustrates a flowchart depiction of a method of performing a scatterometry response analysis, as described in FIG. 5, in accordance with a second embodiment of the present invention.

Turning now to FIG. 8, a second embodiment of the scatterometry response analysis of Block 550 of FIG. 5, is illustrated. The system 100 examines critical regions on the semiconductor wafers (block 910). The system 100 then performs a scatterometry metrology data acquisition process on the processed semiconductor wafer (block 920). The system 100 then calculates and evaluates the signal-to-noise ratio received as a result of the scatterometry stimulation being imposed upon the semiconductor wafer (block 930). In one embodiment the calculation/evaluation of the signal-to-noise ratio is performed by the scatterometry data analysis unit 170. Generally, the more uneven the pattern, the more noise is contained within the signal received from the scatterometry stimulation. Conversely, the more uniform and precise the pattern on the semiconductor wafer, the less the noise in the signal received in response to a scatterometry stimulation imposed upon a semiconductor wafer.

The system 100 makes a determination whether the signal-to-noise ratio of the signal is below a predetermined threshold that corresponds to an expected value for a similar geometrical wafer-structure (block 940). The system 100 compares the signal-to-noise ratios of the semiconductor wafer being processed with the expected value for similar semiconductor wafers with like patterns. When the system 100 makes a determination that the measured signal-to-noise ratio is below the expected signal-to-noise ratio of wafers with similar patterns, the system 100 concludes that the semiconductor wafer does not contain significant overlay error (block 960).

When the system 100 makes a determination that the measured signal-to-noise ratio is above the predicted signal-to-noise threshold for semiconductor wafers with similar geometry patterns, the system 100 concludes that significant overlay errors exist on the semiconductor wafer being processed (block 950). The conclusions drawn by the system 100 regarding overlay errors can be then utilized by the computer system 130 and the manufacturing model 140 to modify and create modified manufacturing parameters designed to reduce overlay errors. The completion of the steps described in FIG. 9 substantially completes the second embodiment of the method for performing the scatterometry response analysis of block 550 of FIG. 5.

Once the analyses described in FIGS. 4–8 are substantially complete, the resulting semiconductor wafer manufacturing processes are performed using modified manufacturing parameters designed to reduce semiconductor wafer errors. The method described by the embodiments illustrated in FIGS. 4–8 can be utilized to improve the manufacturing results of other types of semiconductor manufacturing processes. In addition to implementing the principles taught by the present invention for manufacturing of semiconductor wafers, the principles taught by the present invention can be utilized in other areas of manufacturing.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing at least one semiconductor device;

acquiring metrology data from said processed semiconductor device;

performing a scatterometry overlay analysis based upon said metrology data, performing said scatterometry analysis comprising superimposing a second grating structure above a layer on said semiconductor device wherein said layer comprising a first grating structure, and evaluating an optical signature relating to said first and second grating structures; and calculating at least one modified manufacturing parameter based upon said scatterometry overlay analysis.

2. The method described in claim 1, further comprising processing said semiconductor device in a subsequent manufacturing process based upon said modified manufacturing parameter.

3. The method described in claim 1, wherein processing the at least one semiconductor device further comprises processing semiconductor wafers.

4. The method described in claim 2, wherein processing semiconductor wafers further comprises performing a photolithography process on said semiconductor wafers.

5. The method described in claim 1, wherein acquiring metrology data from said processed semiconductor devices further comprises acquiring scatterometry data.

6. The method described in claim 1, wherein performing scatterometry overlay analysis further comprises:

performing a manufacturing process to superimpose a grating structure above a layer that contains a grating structure;

acquiring pre-determined scatterometry threshold data relating to said superimposed grating structure;

performing a scatterometry response analysis based upon said scatterometry threshold data; and determining an overlay error based upon said scatterometry response analysis.

7. The method described in claim 6, wherein acquiring pre-determined scatterometry threshold data further comprises acquiring at least one of a signal-to-noise ratio specification and a stray light specification that correspond to said grating structure.

8. The method described in claim 7, wherein performing said scatterometry response analysis comprises:

locating at least one of a region and a grating offset on said semiconductor device where said superimposed gratings line up;

performing scatterometry metrology data acquisition upon said region;

evaluating a unique optical signature resulting from said scatterometry metrology data acquisition;

determining whether said unique optical signature is different from a predicted optical signature; and determining that there is a significant overlay error in response to a determination that said unique optical signature is different from said predicted optical signature.

9. The method described in claim 8, wherein scatterometry metrology data acquisition comprises imposing a scatterometry stimulation upon said semiconductor device and collected resultant reflected light.

10. The method described in claim 7, wherein performing said scatterometry response analysis comprises:

locating at least one of a region and a grating offset on said semiconductor device where said superimposed gratings line up;

performing scatterometry metrology data acquisition upon said region;

evaluating a signal resulting from said scatterometry metrology data acquisition;

calculating a signal-to-noise ratio for said signal;

determining whether said signal-to-noise ratio is above a predicted signal-to-noise ratio; and determining that there is a significant overlay error in response to a determination that said signal-to-noise ratio is above said predicted signal-to-noise ratio.

11. The method described in claim 10, wherein said scatterometry metrology data acquisition comprises imposing a scatterometry stimulation upon said semiconductor device and collected a resultant signal.

12. An apparatus, comprising:

means for processing at least one semiconductor device;

means for acquiring metrology data from said processed semiconductor device;

means for performing a scatterometry overlay analysis based upon said metrology data, means for performing said scatterometry analysis comprising means for superimposing a second grating structure above a layer on said semiconductor device wherein said layer comprising a first grating structure, and means for evaluating an optical signature relating to said first and second grating structures; and means for calculating at least one modified manufacturing parameter based upon said scatterometry overlay analysis.

* * * * *